(12) United States Patent
Jäger

(10) Patent No.: US 9,230,838 B2
(45) Date of Patent: Jan. 5, 2016

(54) APPARATUS FOR STORAGE OF OBJECTS FROM THE FIELD OF MANUFACTURE OF ELECTRONIC COMPONENTS

(75) Inventors: Erich Jäger, Frauenfeld (CH); Doris Jäger, legal representative, Frauenfeld (CH)

(73) Assignee: TEC-SEM AG, Tägerwilen (CH)

( * ) Notice: Subject to any disclaimer, the term of this patent is extended or adjusted under 35 U.S.C. 154(b) by 1388 days.

(21) Appl. No.: 12/375,065

(22) PCT Filed: Jul. 20, 2007

(86) PCT No.: PCT/CH2007/000361
§ 371 (c)(1),
(2), (4) Date: Jun. 20, 2011

(87) PCT Pub. No.: WO2008/011741
PCT Pub. Date: Jan. 31, 2008

(65) Prior Publication Data
US 2012/0027547 A1 Feb. 2, 2012

(30) Foreign Application Priority Data
Jul. 26, 2006 (CH) ....................... 1238/06

(51) Int. Cl.
*H01L 21/677* (2006.01)
*H01L 21/673* (2006.01)

(52) U.S. Cl.
CPC ...... *H01L 21/6734* (2013.01); *H01L 21/67346* (2013.01); *H01L 21/67769* (2013.01)

(58) Field of Classification Search
USPC ................. 414/217, 331.05, 416.08
See application file for complete search history.

(56) References Cited

U.S. PATENT DOCUMENTS

| 4,867,629 | A | 9/1989 | Iwasawa et al. | |
|---|---|---|---|---|
| 5,407,181 | A | 4/1995 | Ohsawa | |
| 6,848,876 | B2 | 2/2005 | Babbs et al. | |
| 2002/0197145 | A1* | 12/2002 | Yamamoto et al. | 414/806 |
| 2004/0037675 | A1* | 2/2004 | Zinger et al. | 414/217 |

* cited by examiner

*Primary Examiner* — Saul Rodriguez
*Assistant Examiner* — Willie Berry, Jr.
(74) *Attorney, Agent, or Firm* — McGlew and Tuttle, P.C.

(57) ABSTRACT

A storage apparatus for objects in the manufacture of substrates, in particular of substrates for electronic components, is provided with a housing which forms at least one closed area for storage of the objects. The storage apparatus also has a pure air device by which a pure air atmosphere can be produced at least within a section of the housing. Using at least one input/output device for the storage apparatus, objects can be passed into the interior of the housing or removed from the interior, in which case the objects can be handled by at least one handling device in the interior of the housing, and object receptacles are provided within the housing, in which objects can be temporarily stored outside transport containers. In order to require a position area which is as small as possible for a storage apparatus such as this, despite it having a high storage capacity, the invention provides that two areas which are arranged at least partially one above the other are formed in the same housing of the storage apparatus, with a first area for an object storage device, and a second area for a transport container storage device.

20 Claims, 10 Drawing Sheets

APPARATUS FOR STORAGE OF OBJECTS FROM THE FIELD OF MANUFACTURE OF ELECTRONIC COMPONENTS

CROSS REFERENCE TO RELATED APPLICATIONS

This application is a United States National Phase application of International Application PCT/CH2007/000361 filed Jul. 20, 2007 and claims the benefit of priority under 35 U.S.C. §119 of Swiss Patent Application CH 1238/06 filed Jul. 27, 2006, the entire contents of which are incorporated herein by reference.

FIELD OF THE INVENTION

The invention relates to a storage apparatus for objects in the manufacture of substrates, in particular substrates for electronic components such as, for example, LCD displays, wherein the storage apparatus is provided with a housing which forms at least one closed area for storage of the objects, which has a pure air device by means of which a pure air atmosphere can be produced at least within a section of the housing, which is provided with at least one input/output device by which means the objects can be passed into the interior of the housing or removed from the interior, which has at least one handling device by which means objects can be handled in the interior of the housing, and which has object receptacles inside the housing in which objects can be temporarily stored outside transport containers.

BACKGROUND OF THE INVENTION

In the industrial manufacture of electronic components such as, for example, LCD displays or other flat screens or substrates etc., objects must be regularly transported and temporarily stored inside a factory. Provided for this purpose on the one hand are transport containers in which the objects are securely arranged and transported against external influences. Frequently, so-called SMIF and FOUP boxes are used as transport containers. On the other hand, the objects are temporarily stored in a storage apparatus, as described initially, after or before they are transported in the factory.

Such storage apparatus generally comprise a housing which forms one or more areas which are separate from one another. In order to transfer the objects into this at least one area or remove them therefrom, the storage apparatus has a closable opening. The objects are usually removed mechanically or manually from the transport containers before they are transferred into the area. For transport inside the factory the objects are then removed from the storage apparatus again and inserted outside the area into a transport container stored temporarily outside the storage apparatus. For reasons of maintaining the clean room conditions, an attempt is usually made to store the objects and the transport container separately from one another. In addition, the transport containers are expensive and bulky. If very many objects are used in a factory, the corresponding number of transport containers required is usually also very high.

However, other solutions have also become known in which the substrates can be supplied together with their transport containers to the storage apparatus and only removed from the respective transport containers inside the storage apparatus. Here it is provided after removal of the objects to store the transport container in a first area and the objects in a second area. The two areas are separated from one another by vertical dividing walls pertaining to the housing. However, this solution cannot be satisfactory in that it requires a relatively large floor area. A further disadvantage is the concept-dependent expensive supply of clean air for comparatively large areas.

A solution for a heat treatment apparatus for wafers is known from U.S. Pat. No. 5,407,181 in which a storage chamber for transport containers is separated by a vertical dividing wall from a transfer chamber of the heat treatment apparatus. In the transfer chamber located to the side of the storage chamber, wafers are inserted into a so-called boat with which the wafers are transferred to a reaction furnace located above the transfer chamber. This heat treatment apparatus also requires a comparatively large floor area. In addition, in this apparatus no temporary storage of wafers is possible but merely transfer of always the same number of wafers from transport containers into a reaction furnace.

SUMMARY OF THE INVENTION

It is therefore an object of the invention to provide a possibility by which objects from the manufacture of electronic components and their transport containers for transporting the objects can be temporarily stored in such a manner that only the smallest possible floor area in the factory is required for the intermediate storage.

This object is achieved according to the invention in a storage apparatus whereby two areas which are arranged at least partially one above the other are formed in the same housing of the storage apparatus, with a first area being intended for an object storage device and a second area being intended for a transport container storage device. The present invention is suitable for any objects or substrates from the field of manufacture of electronic elements, components, appliances and the like which are transported inside a production factory usually in transport containers. The usability of the invention is independent of the shape (round, oval, rectangular, octagonal etc.) of the objects or substrates and their materials. Furthermore, the invention is also suitable for the storage of objects located in object carriers. In such an application, the objects are preferably introduced together with their object carriers in the object storage device and received there for storage.

According to the invention, it is therefore provided that the objects and the transport containers provided for transporting them are stored separately from one another but nevertheless locally close to one another inside the same housing. Both the objects and also the transport containers can thus be removed from the manufacturing process by means of the storage device for a predetermined or an undetermined time until they are required again in said process. For this purpose, the objects can be removed from the transport containers. It is hereby possible to avoid chemical contaminations of the substrates which may occur, for example, due to degassing of the plastics of the transport containers. It has been shown that such contamination can occur particularly during fairly long storage of substrates in transport containers. Due to the additionally provided local proximity of the storage sites of the objects on the one hand and the transport containers on the other hand, the objects can be re-supplied to the manufacturing process rapidly and flexibly despite their secure contamination-free storage.

In addition, it is possible with the invention to provide only as many transport containers as is usually required in the factory for substrates in circulation at the same time. As opposed to hitherto, the number of transport containers need not be determined by reference to the total number of substrates which are present and are to be stored.

In this case, it may be preferable if the object storage device provided for receiving the objects and the transport container storage device in which the transport containers are to be temporarily stored are arranged at least substantially, preferably completely, one above the other. As a result, the storage apparatus requires only a particularly small floor area. An arrangement in which the object storage device is located above the transport container storage device has been shown to be particularly favourable here. Despite the spatial proximity of transport containers on the one hand and objects to be removed therefrom on the other hand, due to such an arrangement an advantageous pure air supply from above via a cover wall of the storage apparatus is possible with little technical effect for the object storage device.

The two areas should be located in the same housing but are preferably separated from one another, whereby atmospheres which are separate or isolated from one another can be produced in the areas. In particular, in the area of the object storage device, it should be possible to produce and maintain an atmosphere which satisfies high purity requirements. The transport container storage device can be separated from the object storage device by a dividing wall which runs horizontally at least approximately and in sections inside the housing. In this case, a common drive for the two storage devices can be guided through the dividing wall.

Inside the area of the storage apparatus, the objects and the transport containers can advantageously be inserted into the respective receptacles and removed therefrom by means of respectively one handling device. In order to be able to store a large number of objects and transport containers and nevertheless manage with particularly few handling steps and with short travel distances, a rotatable carousel can be provided, which is equipped with the object receptacles and the receptacles for the transport containers. Such an arrangement makes it possible to increase the number of object receptacles with little technical effort by exchanging these for receptacles for transport containers or conversely as required. The capacity can also be expanded by adding receptacles, for example, by placing further object receptacles onto the hitherto uppermost row of object receptacles on the carousel.

The insertion and removal of objects and transport containers into or from respectively one receptacle can be effected by means of handling devices arranged inside the housing. In this case, respectively one handling device is advantageously assigned to the transport containers and one handling device is assigned to the objects. For executing the relative movements between grippers of the handling devices and the respective receptacle required for this purpose, at least one movement axis can be placed in the receptacles, for example, a rotary movement about a vertical Z axis. The handling device can preferably execute travel movements at least in the direction of the Z and Y axis, to position the gripper at the height of the respective receptacle and move this towards and away from this.

Inside the storage apparatus, it can advantageously be provided that a drive of the handling device of the object storage device is located below an object handling plane of this handling device. The object handling device can be predefined by a position or a plane of the gripper at which this gripper receives the object. This arrangement has the advantage that the entire object storage area can be reached with this handling device as far as just below the cover the housing. Since the lowest position to be approached by this handling device can be provided at the height of an object removal from the respective transport box, the drive mechanism has sufficient free space towards the bottom.

In contrast to this, a drive of the handling device for the transport container storage device can always be located above the handling plane or position which is obtained due to the gripper of the transport container handling device. This makes it possible to use the storage area for the transport container down as far as the bottom of the housing or near the subsurface in which the storage apparatus is located. Since in a preferred embodiment it is not necessary that the handling device of the transport container storage device is movable in the Z direction as far as the housing cover, sufficient space for the drive mechanism is located above the object handling plane. Such a preferred embodiment of the storage apparatus according to the invention makes it possible to completely utilize the height of the storage apparatus with storage places. The storage capacity of the storage apparatus can be increased considerably as a result.

In an expedient embodiment according to the invention, only one drive can be provided for both carousel parts. In a first variant, both carousel parts can be moved simultaneously with the drive. In a second variant, both carousel parts can be moved independently of one another and optionally also in different directions of rotation.

In a preferred embodiment of the invention, a common pure air device can advantageously be provided for the area of the object receptacles and the area of the transport container, from which pure air flows through both areas. This pure air device can be configured in particular in a manner such that a pure air stream flows successively through both areas by means of air guiding means. Alternatively to this, two partial flows of pure air can be produced, each assigned to only one area. In connection with the invention, "pure air" should be understood to mean not only gases which at least correspond approximately to the ambient air. The term "air" should be considered to mean in connection with the invention any gas or gas composition which is suitable as a gas stream for creating and maintaining clean or ultraclean room conditions inside the storage apparatus. The term air should in particular also cover pure nitrogen or pure gases having a high nitrogen fraction.

Due to this possible embodiment according to the invention, clean room conditions can be produced with the same pure air flow both at the objects and at the temporarily stored transport containers. In this case, it can be particularly advantageous if the same pure air flow is guided first through the area of the objects and then through the area of the transport containers.

The logistics required in a factory can be eased substantially if measurement equipment such as particle scanners, layer thickness measuring equipment and/or other metrology components by which means objects can be measured before or after storage are built into the storage apparatus. All the handling steps required for this then take place inside the housing and not in a plurality of individual components inside the factory, which must each be controlled individually by a factory main computer and coordinated with one another.

A particular flexibility is obtained in further preferred embodiments in which the storage apparatus is provided as a so-called stand-alone apparatus which contains no process installation in its housing with which the objects are machined or processed in connection with their manufacture. The site of such a stand-alone apparatus inside a factory can be optimized at any time without major expenditure and substantially only from the logistics point of view. Naturally however, it is also possible to connect a storage apparatus according to the invention either to a process installation or to integrate a process installation in the storage apparatus.

Further preferred embodiments of the invention are obtained from the claims, the description and the drawings. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
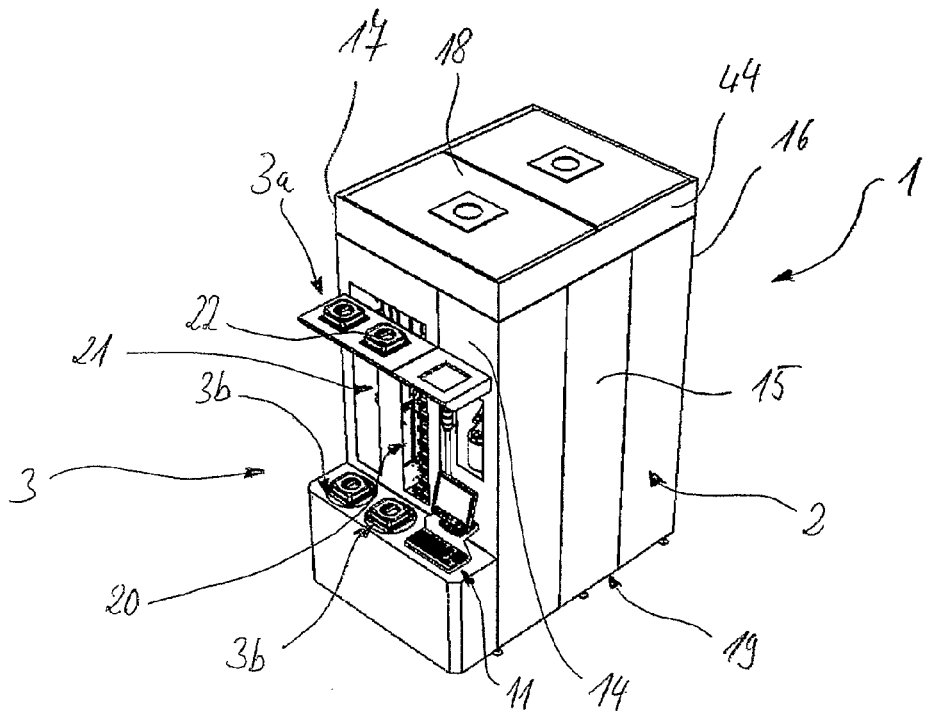
FIG. 1 is a perspective view of a storage apparatus according to the invention.

Referring to the drawings in particular, FIGS. 1 to 16 show a first embodiment of the storage apparatus 1 according to the invention, which is provided for the storage of objects from the manufacture of electronic components or apparatus such as, for example, glass substrates for the manufacture of LCD screens and their transport containers for transport inside a factory producing electronic components. Such objects can be both workpieces and also production means, in particular wafers or reticles, wherein this information is only exemplary and as a result, the suitability of the apparatus according to the invention in connection with all further objects from the field of the manufacture of electronic components or apparatus should not be excluded.

Transport containers for such objects, in particular substrates, are usually closed on all sides. The most commonly used of such transport containers are configured either according to the SMIF or the FOUP standard (SMIF=Standard Mechanical Interface; FOUP=Front Opening Unified Pod). SMIF transport containers have a hood and a base which can be closed with the hood. FOUP containers on the other hand are provided with an opening at the front side which can be closed with a cover. The storage apparatus can be configured in principle for receiving and storing transport containers for respectively only one or for several storage objects such as, for example, substrates of LCD screens or other substrates.

Figure 4:
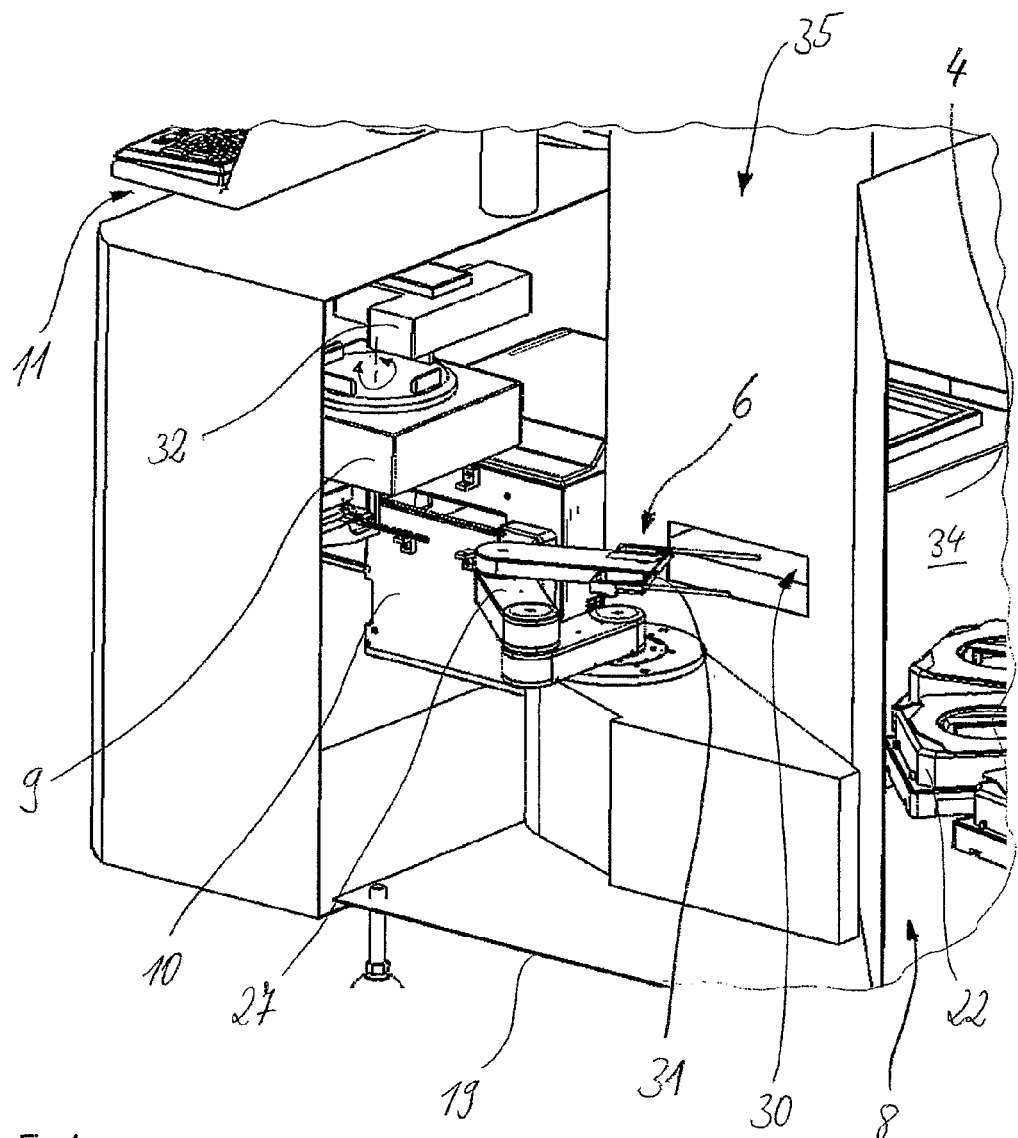
FIG. 4 is a perspective partial view of the storage apparatus with an object handling device arranged therein.

As components, the storage device has a housing 2, an input/output device 3, a transport container opening device 4 (FIG. 4), a transport container handling device 5 (FIG. 2), an object handling device 6, an object storage device 7, a transport container storage device 8, an ID read/alignment device 9 and optional measuring equipment such as, for example, a particular detection device 10 (FIG. 4). All the components are located inside the housing 2.

The housing 2 with its side walls 14, 15, 16, 17 and top and bottom walls 18, 19 consisting, for example, of metal sheets, forms a closed area. In this case, the housing is configured in such a manner than both the front and also the back side can be opened for maintenance purposes. The side walls 15, 17 of the housing 2 located therebetween, however, are not provided for opening, which is why the storage apparatus 1 with its side walls can be positioned adjacent to other factory installations or adjacent to a factory wall. In this way, a number of preferred storage apparatuses 1 according to the invention having a very large storage capacity can be formed in particular on a small floor area in which maintenance and rapid emergency access to all the components of the respective storage apparatus is nevertheless ensured.

Two closable openings 20, 21 of a lower input/output device 3b through which objects can be inserted and removed are provided on a front side of the housing. Located immediately above this opening are two upper input/output devices 3a which are provided for automatic insertion of transport containers 22 into the interior of the housing 2 and for removal from the housing 2. The two upper input/output devices 3a are intended for transferring transport containers 22 supplied from the factory, for example, by an overhead transport system or for delivering transport containers 22 from the storage apparatus 1 to this system in an automated manner. Provided directly below the two openings are two "manual" input/output devices 3b on which transport containers 22 are placed manually so that these can be inserted into the housing 2 in an automated manner by lowering the container. With the storage apparatus 1, transport containers 22 can also be dispensed from the interior of the housing 2 to the "manual" input/output device. Such input/output devices 3a and 3b are, for example, previously known by the test wafer stocker TWS300 already supplied by the Applicant Tec-Sem AG or the product "Practor 300 with Foup Buffer".

From one of the input/output devices 3a, 3b a transport container 22 arrives at the transport container opening device 4 which is already entirely located inside the housing 2 and which can be configured in principle in the same way as is described for SMIF transport containers in EP 0 875 921 A1. The content of this document is herewith completely included by reference. In principle, however, any other transport container opening device 4 with which the respective transport boxes can be opened and closed is suitable in connection with the invention.

The transport containers arrive at the transport container opening device 4 by means of a rotating device, for example, which is preferably located below a plate on which the respective transport container is placed and which turns the plate by turning about an axis in the direction of the transport container handling device. The transport container handling device 5 can grasp the respective transport container in this alignment and move it into the system. The transport containers have a standardized handling adapter on their upper side whereby they can be grasped by the transport container handling device 5.

The transport container opening device 4 is used for automated opening and closing of transport containers 22 inside the storage apparatus. In the embodiment of the invention shown it is thus provided that the transport containers together with their contents are introduced closed into the interior of the storage apparatus 1 and only opened there.

Figure 3:
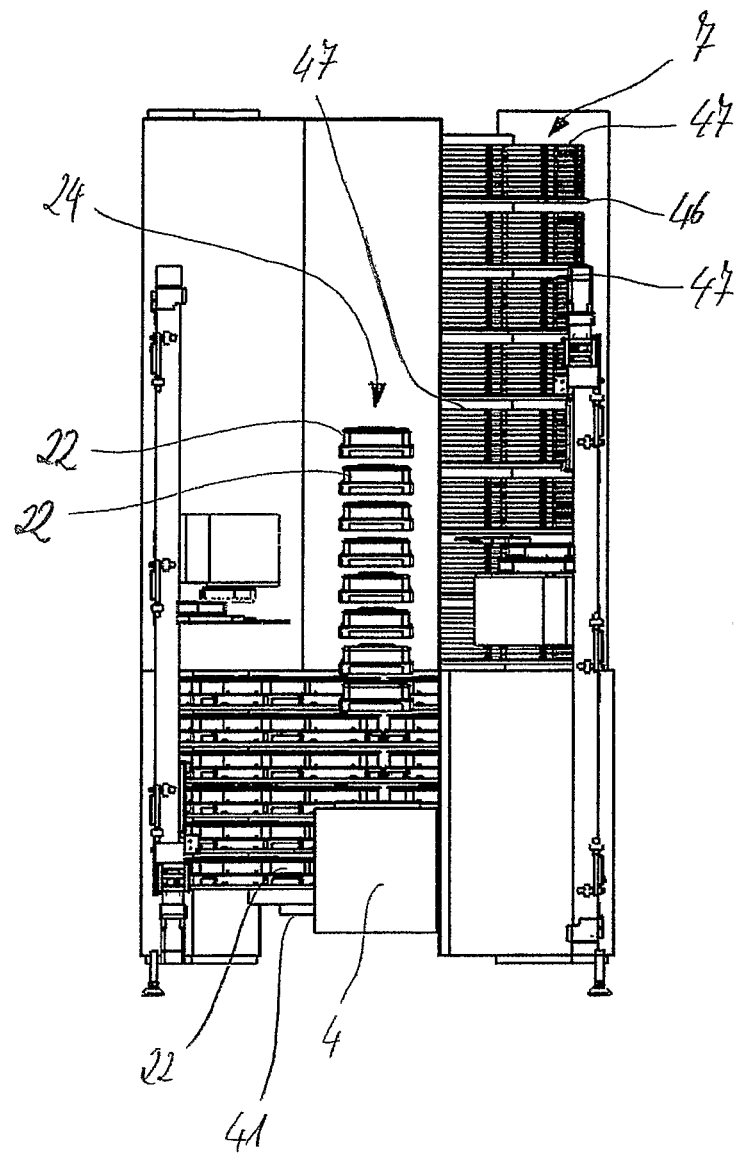
FIG. 3 is a side view of the opened storage apparatus from FIG. 1.

As can be seen in particular from FIG. 3, a buffer 24 for a comparatively small number of transport containers 22 is provided directly above the transport container opening device 4. This buffer 24 which can accommodate, for example, ten, preferably empty transport containers 22, serves to transfer one or more objects particularly rapidly into transport containers and remove them from the storage apparatus. Due to the buffer 24, a transport container for receiving a corresponding object and for subsequently removing from the storage apparatus is ready almost immediately after requesting a certain object. The transfer time for removal of a transport container 22 from the transport container storage device 8 described in further detail subsequently, to the transport container opening device 4 can be avoided as a result. It is also possible to fill the transport containers 22 in the buffer 24 with objects such as substrates already requested by a host system. During retrieval, these can then be output without delay from the stocker or the storage apparatus for dispensing. A similar advantage can also be achieved by storage of transport containers filled with substrates in the transport container storage area.

Figure 2:
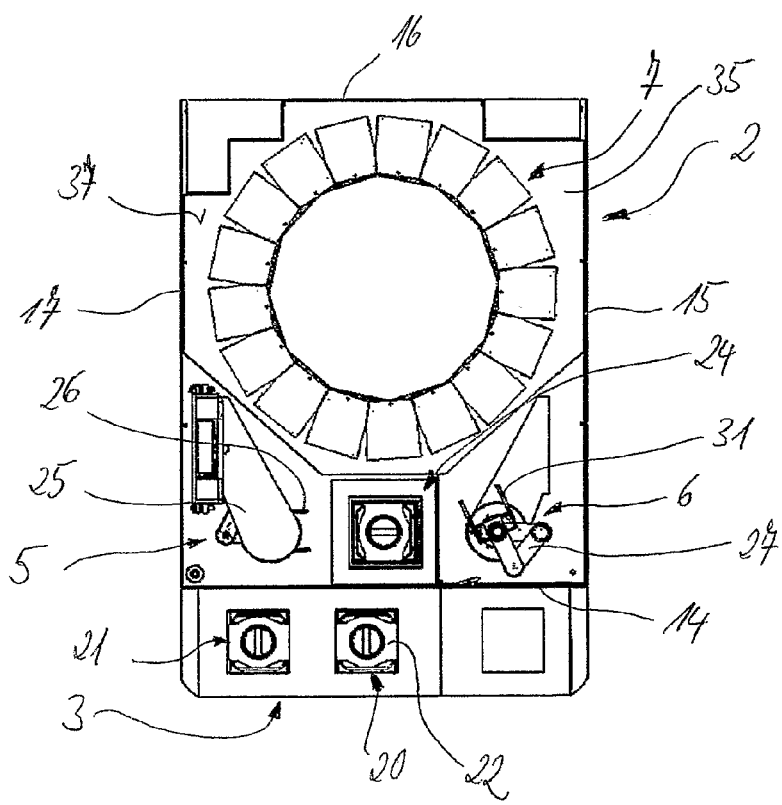
FIG. 2 is a view from above into the storage apparatus from FIG. 1.

Located in a corner region of the front wall with a side wall of the storage apparatus which can be seen in particular in FIG. 2, is the transport container handling device 5 by which means transport containers can be transported from the transport container opening device 4 to the transport container storage device and vice versa. In the exemplary embodiment, the transport container handling device 5 is configured as an articulated-arm robot 25 which is movable longitudinally along a Z axis (perpendicular to the plane of the drawing in FIG. 2) in the vertical direction. With the articulated arm the articulated-arm robot 25 executes movements within X-Y planes (parallel to the plane of the drawing in FIG. 2). For handling the transport containers a passive gripper 26 is affixed to the articulated arm by which means the articulated-arm robot acts on the top-side handling adapter of the respective transport container 22 configured as an SMIF box in the exemplary embodiment.

The object handling device 6 is located in the opposite corner region of the front wall on the other side of the transport container opening device 4. This is in principle configured in the same way as the transport container handling device 5, i.e., as an articulated-arm robot 27 movable in the X-Y plane, which is additionally movable in the Z direction. The articulated-arm robot 27 of the object handling device is provided for transporting and handling substrates 29 arranged in substrate carriers 28 (see, for example, FIG. 6) from the transport container opening device 4 to the object storage device 7 and vice versa. Preferably provided on this articulated-arm robot 27 is a passive two-armed gripper 31 for the handling of individual substrate carriers 28 which can grip through an opening 30 into the transport container opening device 4 and take up a substrate carrier from there or transfer a substrate carrier 28 to this device. Instead of articulated-arm robots, other types of handling devices can also be provided in connection with the invention, for example, robots having linear movement axes.

For gripping a substrate carrier 29, the forks-shaped gripper 31 is moved under a substrate carrier 28, which is still arranged, for example, in a transport container 22 and by raising the gripper 31, the substrate carrier together with the substrates located therein is grasped and subsequently transported by movement of the three robot axes.

The ID read/alignment station 9 is located in the immediate proximity of the transport container opening device 4 and of the object handling device 6 in the housing 2, below a control station 11 located externally on the housing 2 (FIG. 1, FIG. 4). With the aforesaid ID read/alignment station, barcodes inserted or attached to substrates 29 or substrate carriers 28 can be automatically detected and the substrates or substrate carriers thereby identified. For this purpose the ID read/alignment station can be provided with a camera, not shown in detail, and with suitable evaluation software for evaluating the camera signals. Such optical detection systems for reading out information contained in bar codes are previously known per se. By means of the ID read/alignment station 9 the objects can be brought by means of a rotary movement into a position possibly in front of the camera 32 of the station 9 in which the camera 32 can read the barcode or another identification means. If no barcode is identified during a first reading process on one of the respective side faces of the object, it can be assumed that this is located in a position turned through 90°, 180° or 270°. With the device 9, objects located thereon can be transferred into the said rotational position by rotary movements of the device 9 about a vertical Z axis.

Figure 5:
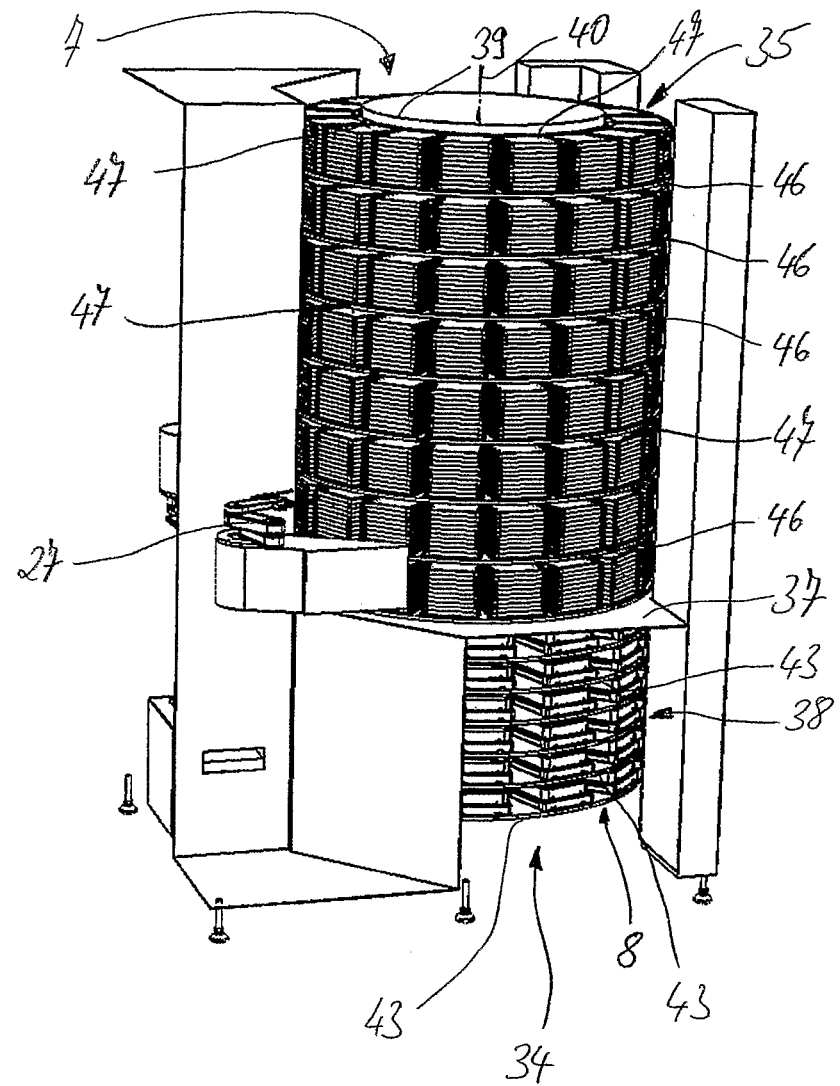
FIG. 5 is a further perspective partial view of the storage apparatus.

As can be seen in particular from FIG. 5, two areas 34, 35 which are spatially separated from one another, are formed in the housing, different clean room conditions being produced therein. These comprise a lower area 34 for the transport container storage device 8 and the transport container handling device 5 as well as an upper area 35 for the object storage device 7 and for all other components of the storage apparatus which come into contact directly with the objects such as, for example, the ID read station 32 and the object handling device 6. An atmosphere which satisfies the highest clean room demands, for example, clean room conditions as described in the standard 14644-1 "Classification of Air Cleanliness" ISO:1 is created in the upper area 35. The lower area 34 on the other hand, only satisfies less demanding clean room conditions but which is sufficient since no objects enter into this region, and certainly not objects stored open, as is the case in the upper region. The two regions are separated from one another by a horizontal dividing wall 37.

Both the transport container storage device 8 and the object storage device 7 are configured at least approximately as hollow-cylindrical carousels 38, 39 (FIG. 5) which are rotatable about a common vertical axis of rotation 40. In a first variant shown in FIG. 5, the two carousels 38, 39 are rotatable independently of one another with their own drive in each case. The two storage devices 7, 8 can be rotated simultaneously in opposite directions of rotation about the axis of rotation 40. In an alternative embodiment, only one common drive can be provided for both carousels by which means both carousels can only be rotated jointly. However, movements independent of one another can also be produced with only one drive which, for example, acts on the one or the other storage device as desired by means of a switching process or a coupling.

In the exemplary embodiment shown, only the electrical drive 41 of the lower carousel 38 is shown, which is arranged in the bottom area of the housing 2 and a pulley is located in its driven shaft, not shown in detail. An endless belt guided around the pulley is further guided around a disk having a significantly larger diameter than the pulley, the axis of rotation of the disk being in alignment with the vertical axis of rotation 40 of the carousel 38. The drive movement of the electrical drive 41 is thus transmitted to the transport container storage device 8 in a stepped-down manner. For the object storage device 7 a device of fundamentally the same type can be provided in the upper region 35 for driving the carousel designated with 39. By switching the direction of rotation of the respective electrical drive, both storage devices can be turned in respectively both directions of rotation.

On its outer peripheral surface the transport container storage device 8 has a plurality of receptacles for transport containers 22 which are arranged in the form of a plurality of disks 43 arranged one above the other horizontally and annularly adjacently to one another and one above the other in the carousel 38. As a result of this configuration, a matrix-like arrangement of receptacles for transport containers 22 is obtained. In the exemplary embodiment shown in FIG. 5, six annular rows are provided, for example, by six disks 43 in which a receiving capacity of twelve receptacles for respectively one transport container 22 is provided. As a result, an overall receiving capacity of 72 transport containers is obtained.

In the upper area 35, the transport container storage device 8 is supplied with nitrogen or clean air by a pure air supply located under the top wall 18 of the housing 2 (FIG. 1). In this case, a gas flow directed from top to bottom approximately centrally into the upper carousel 39 (FIG. 5) is produced by a fan-filter unit 44. As a result of the direction of the gas flow and an excess pressure in the upper area 35 and also due to ducts through the horizontal dividing wall 37 not shown in detail, the pure air can enter into the lower area 34 after it has flowed through the upper area 35. The ducts can be configured, for example, as perforations of the dividing wall 37. Alternatively to this however, a separate (pure) gas supply, in particular for nitrogen, can be provided for each receptacle. The connections for gas flushing of the container 22, already known from specified transport containers 22, can be connected hereto with the result that long-term storage for objects remaining in the transport containers is possible, in particular in a nitrogen atmosphere.

In order to access a specific receptacle 42, it is provided that the relevant receptacle 42 of the transport container storage device 8 is transferred into a predetermined rotational access position by means of the electrical drive 41. Likewise, the transport container handling device 5 is moved to a height in relation of the Z axis which corresponds to the Z position of the respective receptacle 42. With regard to the X-Y position, the gripper is transferred into the access position by means of a travel movement of the articulated arm of the robot. It can advantageously be provided that all the receptacles of one row or disk 43 are transferred into the same access position in each case for access.

The object storage device 7 arranged above the transport container storage device 8 has a plurality of annular shelves 46 arranged in parallel one above the other, the number of which can be variable. The same number of storage modules 47 which are explained in further detail hereinafter, is arranged on each shelf 46, each storage module 47 being provided with ten storage elements 48 stacked one upon the other in each case. As is shown inter alia in FIG. 6, the storage elements 48 in this exemplary embodiment are configured as annularly closed into themselves and approximately tetragonal-shaped. In each case, each storage element 48 is provided for receiving and depositing in each case only one object or substrate carrier 28.

Each storage element 48 is provided with a storage area 48a and with a storage area 48b. In this case, the storage area 48a is configured in such a manner that the respective storage element 48 is suitable for arrangement, in particular for stacking on a base or on the storage element 48 arranged in each case under said element. At the same time, the upper side of the storage area 48a is provided for arranging thereon a following storage element upwards in the stack. The storage area 48b is used for receiving a storage object. The fundamental structure of such storage elements 48 and storage modules 47 or storage towers formed with these as well as their handling has already been described in WO 2005/006407 A1 and CH 01150/05 from the same applicant. The content of these documents is herewith included by reference in its entirety.

Figure 6:
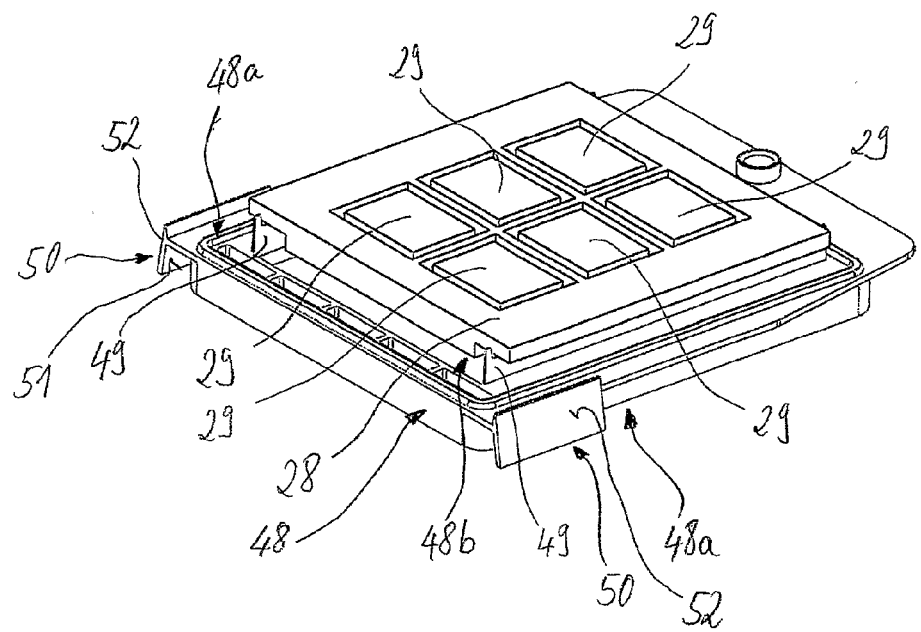
FIG. 6 is a perspective view of a storage element with substrate carrier arranged thereon.
Figure 7:
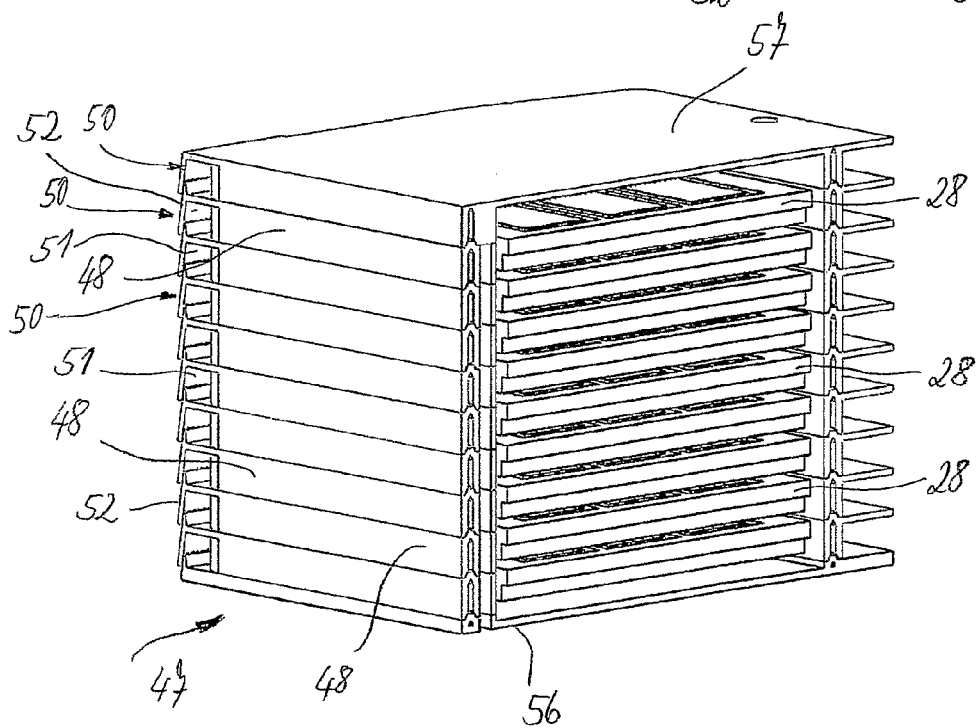
FIG. 7 is a cutaway perspective view of a storage module with storage elements formed according to FIG. 6.

As can be seen in FIG. 6 in particular, the storage area 48b of each storage element has two webs 49 running parallel to one another on an inner side on two mutually opposite sides, a substrate carrier 28 resting thereon. The webs 49 can yield at least slightly elastically to the weight of the substrate carrier. An underside of a substrate carrier 28 received in this way by a storage element is located at least slightly above a lower standing surface of its storage element 48 with which this abuts against a storage element 48 located thereunder. In each of the storage elements 48 of the storage module arranged one above the other, only one substrate carrier 28 is stored in each case always in the same way. In addition each storage element 48 has respectively one centering element 50 at two of its opposite side edges running parallel to one another. Each of the centering elements 50 is directed obliquely outwards in relation to a viewing direction from top to bottom. The centering elements 50 each have an inner and an outer, substantially flat centering face 51, 52.

For stacking the storage elements 48 to form a storage module 47 configured as a storage tower, extending in the vertical direction, the two inner centering faces of the respectively upper storage element 48 abut against the two outer centering faces 52 of the storage element 48 located thereunder in each case. When stacking storage elements, which are always of the same type, a self-centering of the storage elements in the storage module 47 thus takes place due to the two conically arranged centering elements 50 of each storage element 48.

Figure 8:
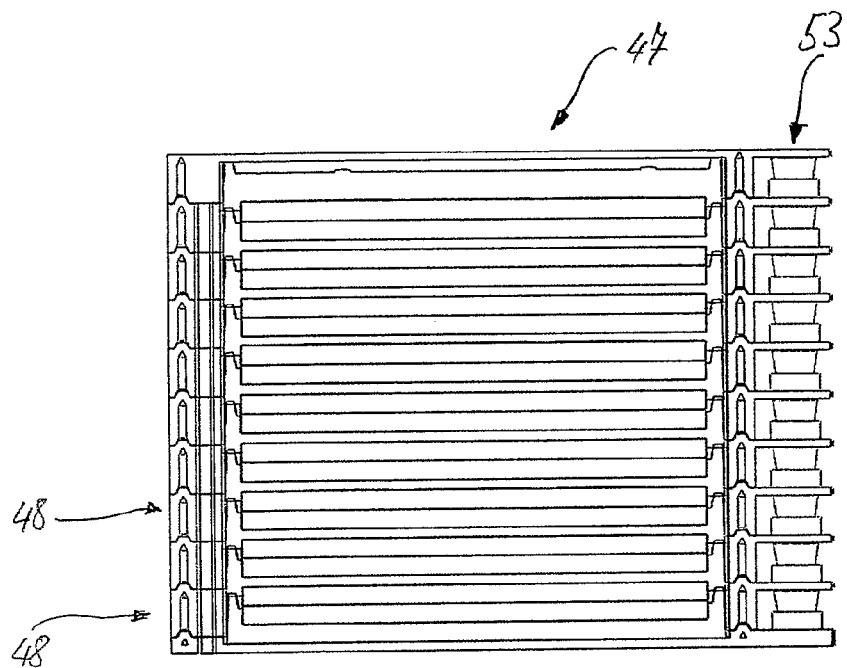
FIG. 8 is a side view of a storage module.
Figure 9:
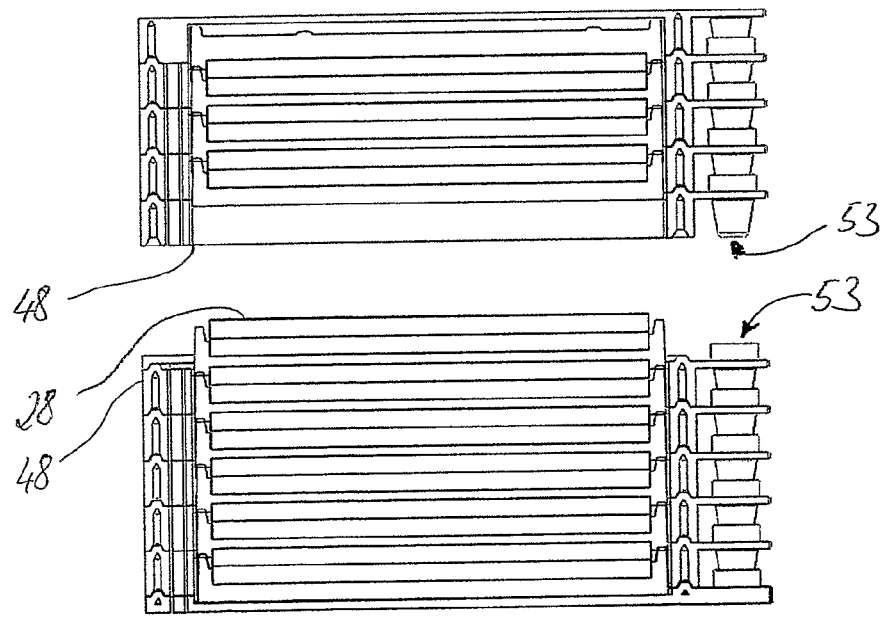
FIG. 9 is a side view of an opened storage module.
Figure 10:
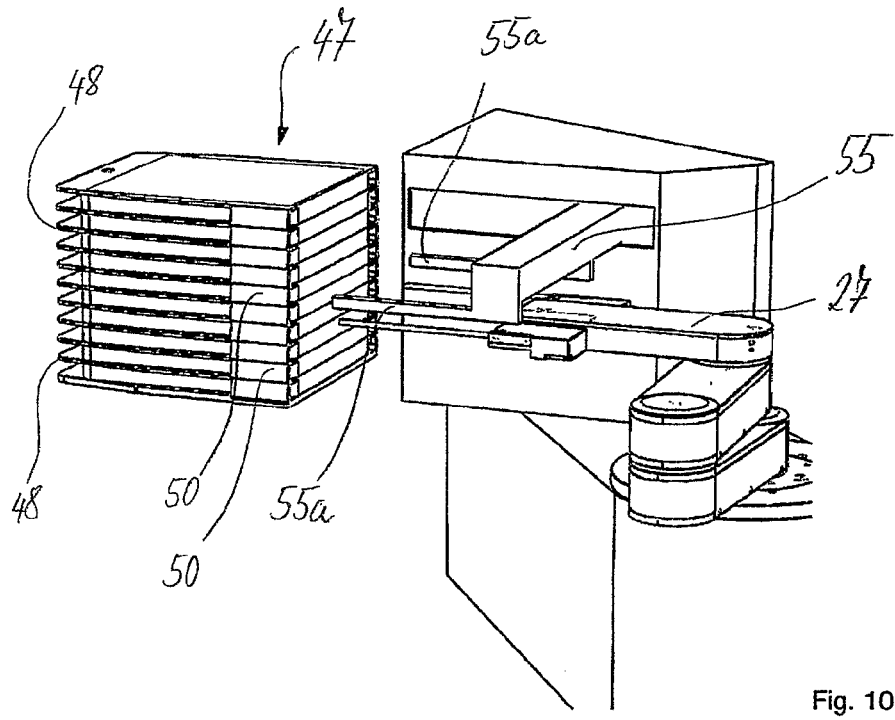
FIG. 10 is a perspective view showing a state during handling steps of a module opener and an object handling device for removing a substrate carrier from a storage module.
Figure 11:
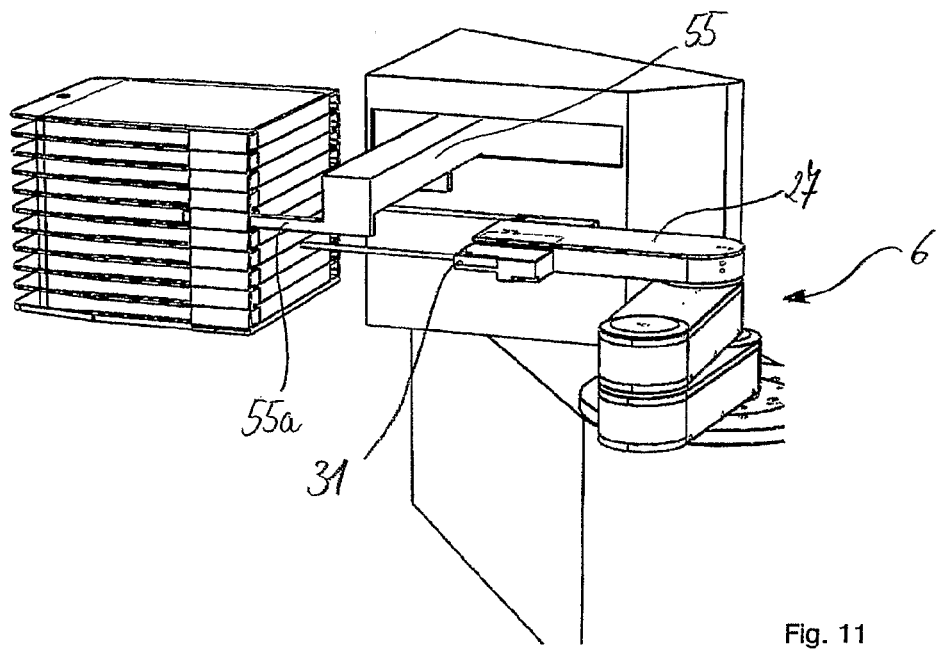
FIG. 11 is a perspective view showing another state during handling steps of a module opener and an object handling device for removing a substrate carrier from a storage module.
Figure 12:
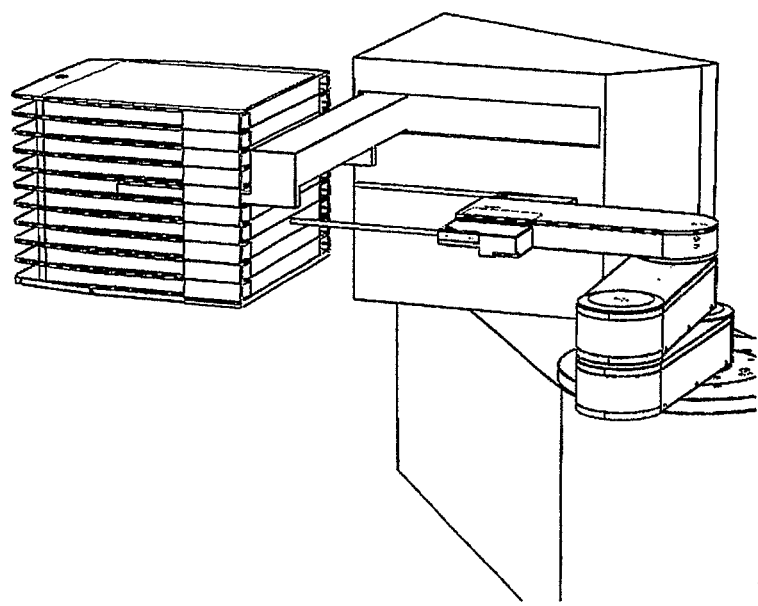
FIG. 12 is a perspective view showing another state during handling steps of a module opener and an object handling device for removing a substrate carrier from a storage module.
Figure 13:
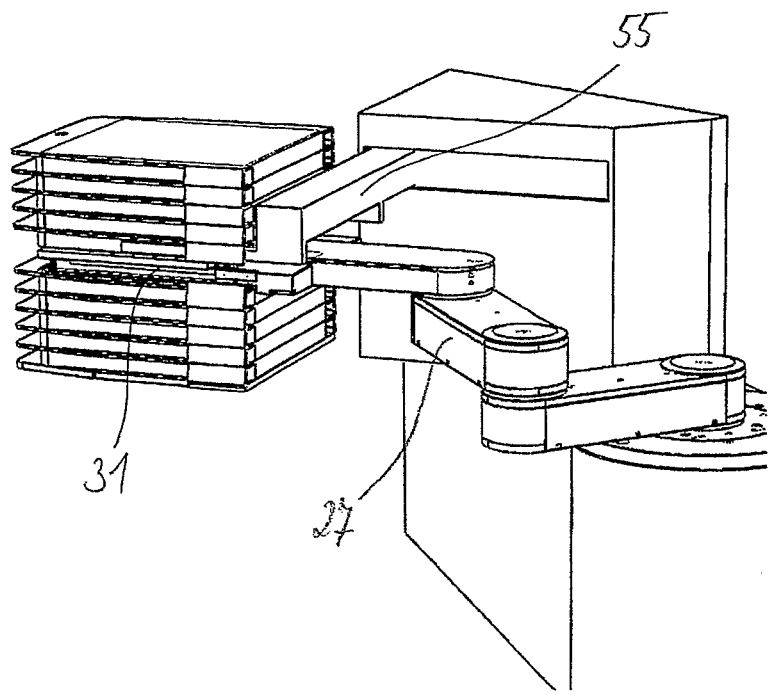
FIG. 13 is a perspective view showing another state during handling steps of a module opener and an object handling device for removing a substrate carrier from a storage module.
Figure 14:
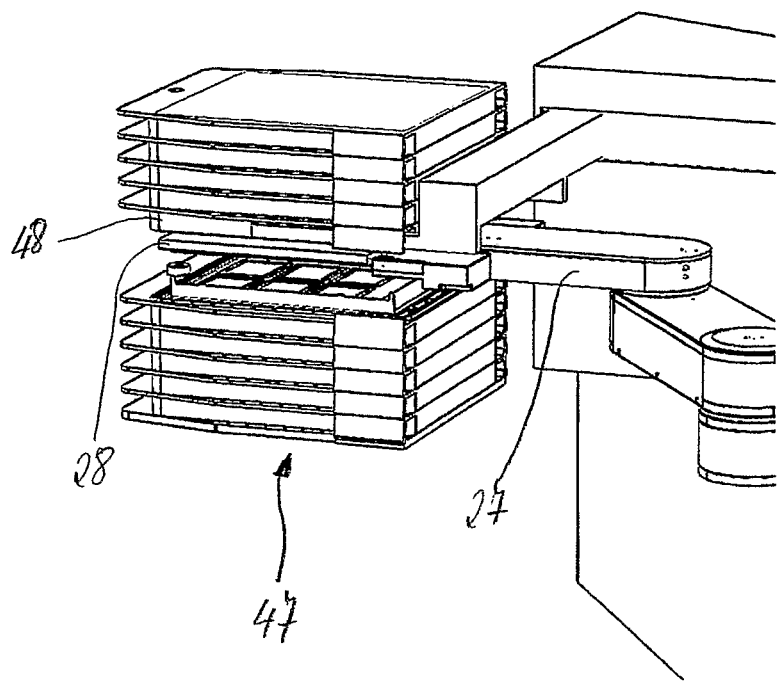
FIG. 14 is a perspective view showing another state during handling steps of a module opener and an object handling device for removing a substrate carrier from a storage module.

As can be seen in particular in FIGS. 8 and 9, the storage elements 49 form a through channel 53 in each case on one side of each storage module 47 through which clean room air (filtered air or nitrogen) can be passed from bottom to top through the storage module 47. A rotational passage for the clean room air, not shown, is provided at the lower or upper end of the carousel 39 into a compressed air line of the carousel of the object storage device 7, not shown in detail. In the interior the supply is divided by means of compressed air lines leading to the individual storage modules, to which the respectively lowest storage element of a storage module is connected. As a result of the openings of the channel 53 directed towards the substrates, which are not shown, a vertical particle barrier is formed in each storage module 47. The storage elements 48 stacked one upon the other in each case form a gap between two successive storage elements, through which the pressurized gas in the channel 53 can flow substantially in the horizontal direction over the substrate carriers 28 and substrates 29. This can contribute towards flushing of the storage objects with pure air or nitrogen taking place during storage of the substrates and thus contamination with particles can be prevented or already existing contamination can be removed.

In order to access a substrate carrier 28 located in a storage module 47, the storage module 47 of the respective substrate carrier 28 is rotated by means of the electrical drive of the carousel 39 in relation to a rotational position of the carousel into an access position for the object handling device 6. Substantially at the same time, the gripper of the articulated-arm robot 27 as well as a likewise fork-shaped module opener 55 (FIGS. 10 to 16) can be transferred in the Z direction to the required access height for the respective substrate carrier 28 and in relation to the X-Y plane directly in front of the corresponding storage module 47. The module opener 55 is linearly movable in each case in the Z and Y direction. The mobility of the module opener 55 and the object handling device in the Z direction can preferably be produced by a common drive which reduces the constructive, in particular the mechanical, expenditure of the storage apparatus.

Figure 15:
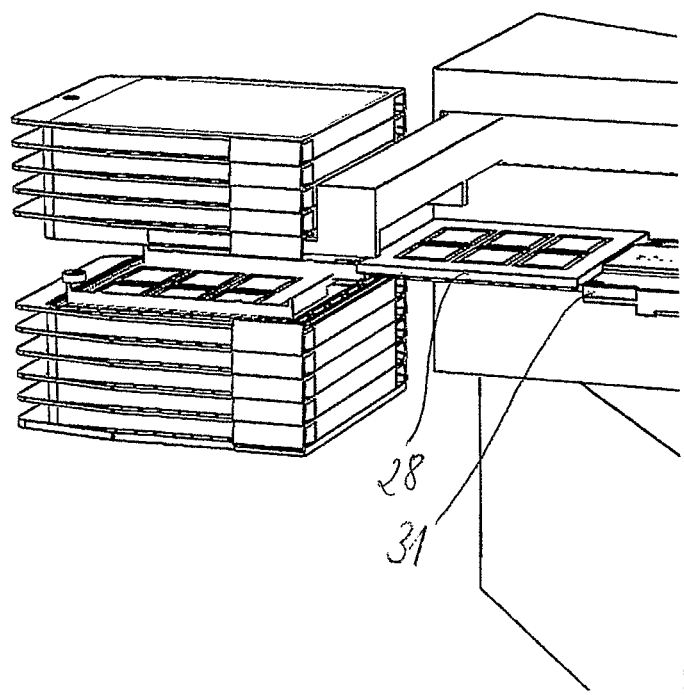
FIG. 15 is a perspective view showing another state during handling steps of a module opener and an object handling device for removing a substrate carrier from a storage module.
Figure 16:
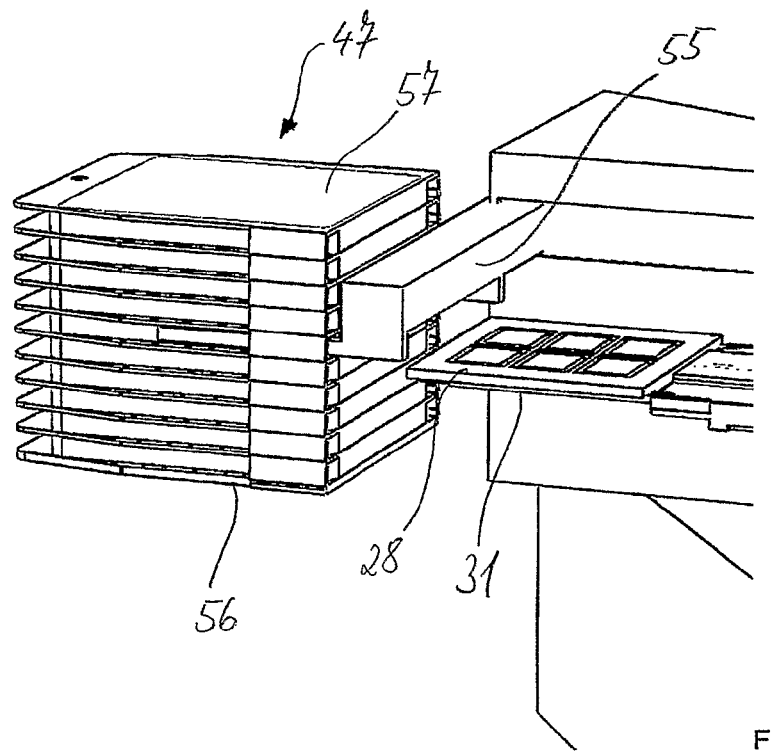
FIG. 16 is a perspective view showing another state during handling steps of a module opener and an object handling device for removing a substrate carrier from a storage module.

From here the module opener 55 with its two forks travels laterally from the centering element 50 into the storage module and raises the storage element located immediately above the substrate carrier 28 to be removed (FIGS. 10 to 13). Naturally, all the other storage elements 48 located thereabove are also raised in this case. The fork-shaped gripper 31 then grasps the respective substrate carrier 28 between its forks, raises it with respect to its storage element 48 and removes it from the storage module (FIGS. 15, 16). The module opener 55 can now be lowered again and the storage module 47 hereby closed (FIG. 16). In fundamentally the same way but with an opposite direction of movement of the respective storage carrier, such a storage carrier can also be inserted into a specific storage element of the storage module 47.

With the object handling device 6 a substrate carrier can also be transferred to the particle detection device 10 (FIG. 4), delivered to this and removed from this again after the inspection. Such a particle detection device can be configured, for example, in accordance with the particle detection device described in WO 02/01292 A1. The content of WO 02/01292 A1 is herewith fully included by reference. Instead of such a detection device, in principle any other particle detection device which can be integrated in the housing of the storage apparatus can be used in connection with the present invention.

The storage apparatus is additionally provided with a control device whose computer and control software coordinates the individual components of the storage apparatus with one another, stores data detected by the components or other sensors and optionally makes available other components. In addition, the control device can be connected to a superordinate factory control. The operation station 11 of the control device can be seen, for example, in FIG. 1.

In preferred embodiments of the invention, the storage modules 47 can be designed with floor and cover elements 56, 57 (FIG. 7) and as a result, simultaneously form in its entirety an independent store and transport container by which means objects can be transported in a normal factory environment. This system in particular opens up the possibility for removing substrates in an emergency or if maintenance work needs to be carried out in the interior of the storage area. If a substrate is required in the case of a machine breakdown, this can be accessed very easily. For this purpose the side wall of the rear side configured as doors is opened and the drive of the carousel 39 can be released with a manually controllable coupling. The carousel 39 can then be turned by hand to the correct position and the storage module 47 with the required substrate can now be removed in its entirety from the apparatus. The storage module can and should be transported in the closed state through the normal factory environment and only opened at a clean room workplace in order to transfer the corresponding substrate manually to a transport container. The substrates are completely located in a perfect clean room environment.

Figure 17:
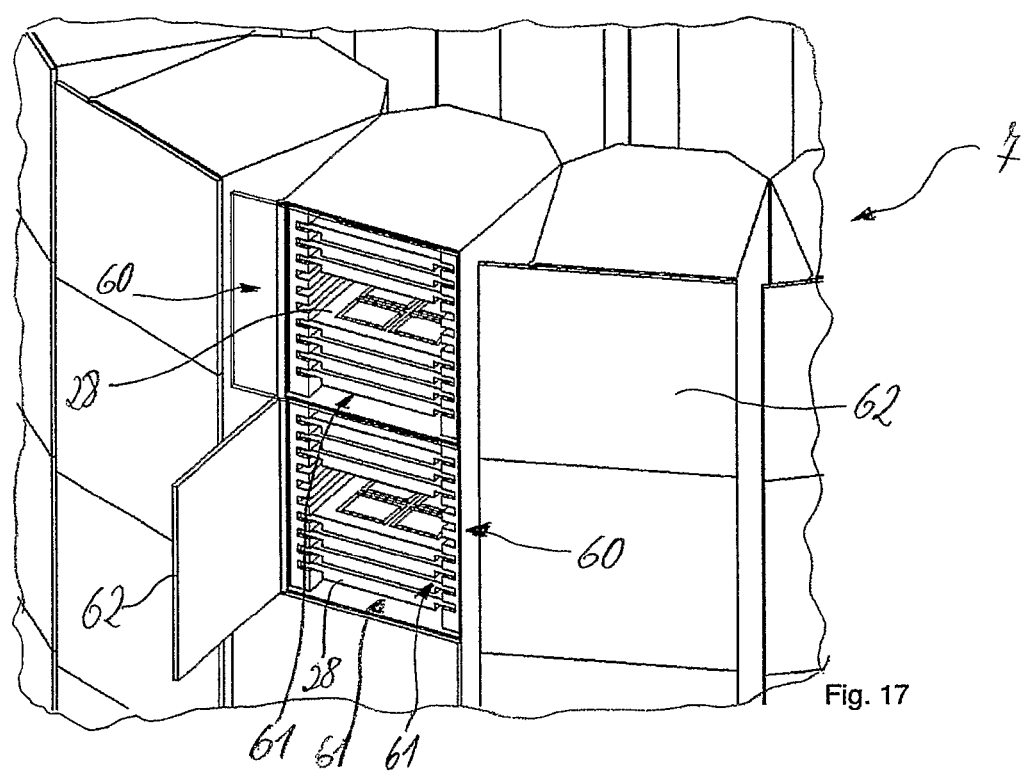
FIG. 17 is a perspective partial view of an alternative object storage device.

FIG. 17 shows a further exemplary embodiment according to the invention. To avoid repetition, only substantial differences compared with the exemplary embodiment in FIGS. 1 to 16 are discussed hereinafter. In this case, components which are identical in principle have the same reference numerals.

The exemplary embodiment in FIG. 17 primarily differs from the first exemplary embodiments by means of the differently configured object storage device 7. FIG. 17 shows a section of the possible embodiment of the object storage device 7 in which box-shaped compartments 60 are provided in a plurality of rings, in which a plurality of receptacles 61 are formed for horizontal arrangement of substrates 29 or a substrate carrier 28 in each case. Each compartment 60 can be closed with its own laterally pivotally articulated and sealed door 62. Each compartment 60 is permanently flushed by means of a nitrogen connection not shown in detail. When a substrate carrier 28 is removed or inserted, the nitrogen fraction drops temporarily to the level of the ambient air and increases again as soon as the door is shut. A, for example, pneumatically driven device whose pneumatic cylinders receive actuating signals from the control device can be provided for opening and closing the doors.

While specific embodiments of the invention have been shown and described in detail to illustrate the application of the principles of the invention, it will be understood that the invention may be embodied otherwise without departing from such principles.

The invention claimed is:

1. A storage apparatus for objects in the manufacture of substrates for electronic components, the storage apparatus comprising:

a housing which has an interior and forms at least one closed area for storage of the objects;

a pure air device by means of which a pure air atmosphere can be produced at least within a section of the interior of the housing;

an input/output device by which the objects can be passed into the interior of the housing or removed from the interior;

a handling device by which objects can be handled in the interior of the housing;

an object storage device inside the housing in which objects can be temporarily stored outside transport containers;

a transport container storage device for storing a plurality of transport containers, said handling device being arranged to remove objects from one of said plurality of transport containers before the one of the plurality of transport containers is moved to said transport container storage device; and two areas, arranged at least partially one above the other, formed in said housing, wherein a first area includes said object storage device and a second area includes an area for said transport container storage device, wherein said first area and said second area provide a carousel-like arrangement of the two storage devices for objects and for transport containers located one above the other.

2. The storage apparatus according to claim 1, further comprising movement means for producing relative movements between the two storage devices on the one hand and the handling device on the other hand.

3. The storage apparatus according to claim 2, wherein the object storage device and the transport container storage device are provided with rotary movement means for executing rotary movements about a substantially vertical axis of rotation.

4. The storage apparatus according to claim 3, wherein the two storage devices are jointly rotatable about the axis of rotation.

5. The storage apparatus according to claim 3, wherein:
said transport container storage device is separated from said object storage device by an approximately horizontally running dividing wall whereby different clean room conditions can be produced in both said first and second areas.

6. The storage apparatus according to claim 1, wherein the two areas are separated from one another by a dividing wall whereby different clean room conditions can be produced in both areas.

7. The storage apparatus according to claim 1, wherein a common pure air supply is provided for the area of the object storage device and the area of the transport container storage device whereby a pure air flow flows successively through both areas.

8. The storage apparatus according to claim 7, wherein at least part of the pure air flow has a component from outside in the direction of the interior of the carousel-like configured object storage device.

9. The storage apparatus according to claim 1, wherein a transport container opening device is provided in the housing and a transport container handling device is preferably provided on one side thereof and an object handling device for handling the objects to be stored is provided on the other side thereof.

10. The storage apparatus according to claim 1, wherein said handling device includes an object handling device and a transport container handling device which are each provided with a drive for executing movements in an at least substantially vertical direction, wherein the drive of the object handling device is always located below a gripper of the object handling device and the drive of the transport container handling device is always located above a gripper of the transport container handling device.

11. The storage apparatus according to claim 1, wherein the object storage device comprises a plurality of storage modules which are each provided with a plurality of storage elements, wherein the storage elements provided for receiving respectively a substrate carrier or a substrate, are stackable one upon the other and movable relative to one another.

12. The storage apparatus according to claim 11, wherein said storage modules can be flooded with nitrogen by supplying nitrogen in a lateral vertical channel of the storage modules, from which the nitrogen flows at least approximately horizontally through the individual storage elements.

13. An object storage module for arrangement in a storage apparatus according to claim 11, wherein the storage module is provided with a plurality of storage elements which can be stacked one upon the other in the vertical direction and moved relative to one another, in particular which can be separated from one another, each storage element has a receiving area for receiving only one object and a storage area for arranging with respect to a following storage element in the stacking direction.

14. The object storage module according to claim 13, wherein an area which is closed with respect to the surroundings is formed particular as a result of a base element arranged on the underside of the storage module and a cover element arranged on the upper side in the interior of the storage module.

15. The storage apparatus according to claim 1, wherein:
said handling device removes the objects from the plurality of transport containers and moves the objects separate from the transport containers to the object storage device.

16. The storage apparatus according to claim 1, wherein:
said object storage device and said transport container storage device separately store the object and the transport containers respectively.

17. The storage apparatus according to claim 1, wherein:
said transport container storage device and said object storage device are provided with a common drive;
said handling device is arranged in the area of said object storage device;
the storage apparatus is built as a standalone apparatus which does not include structure in said housing for processing the objects.

18. A storage apparatus for objects in the manufacture of substrates for electronic components, the storage apparatus comprising:
a housing which has an interior and forms at least one closed area for storage of the objects;
a pure air device by means of which a pure air atmosphere can be produced at least within a section of the interior of the housing;
an input/output device by which the objects can be passed into the interior of the housing or removed from the interior;
a handling device by which objects can be handled in the interior of the housing, wherein said handling device includes an object handling device and a transport container handling device which are each provided with a drive for executing movements in an at least substantially vertical direction, wherein the drive of the object handling device is always located below a gripper of the object handling device and the drive of the transport container handling device is always located above a gripper of the transport container handling device;
an object storage device inside the housing in which objects can be temporarily stored outside transport containers;
a transport container storage device for storing a plurality of transport containers, said handling device being arranged to remove objects from one of said plurality of transport containers before the one of the plurality of transport containers is moved to said transport container storage device; and
two areas, arranged at least partially one above the other, formed in said housing, wherein a first area includes said object storage device and a second area includes an area for said transport container storage device.

19. A storage apparatus for objects in the manufacture of substrates for electronic components, the storage apparatus comprising:

a housing which has an interior and forms at least one closed area for storage of the objects;

a pure air device by means of which a pure air atmosphere can be produced at least within a section of the interior of the housing;

an input/output device by which the objects can be passed into the interior of the housing or removed from the interior;

a handling device by which objects can be handled in the interior of the housing;

an object storage device inside the housing in which objects can be temporarily stored outside transport containers, wherein said handling device removes the objects from the plurality of transport containers and moves the objects separate from the transport containers to the object storage device;

a transport container storage device for storing a plurality of transport containers, said handling device being arranged to remove objects from one of said plurality of transport containers before the one of the plurality of transport containers is moved to said transport container storage device; and two areas, arranged at least partially one above the other, formed in said housing, wherein a first area includes said object storage device and a second area includes an area for said transport container storage device.

20. A storage apparatus for objects in the manufacture of substrates for electronic components, the storage apparatus comprising:

a housing which has an interior and forms at least one closed area for storage of the objects;

a pure air device by means of which a pure air atmosphere can be produced at least within a section of the interior of the housing;

an input/output device by which the objects can be passed into the interior of the housing or removed from the interior;

a handling device by which objects can be handled in the interior of the housing;

an object storage device inside the housing in which objects can be temporarily stored outside transport containers;

a transport container storage device for storing a plurality of transport containers, said handling device being arranged to remove objects from one of said plurality of transport containers before the one of the plurality of transport containers is moved to said transport container storage device; and two areas, arranged at least partially one above the other, formed in said housing, wherein a first area includes said object storage device and a second area includes an area for said transport container storage device, wherein said transport container storage device and said object storage device are provided with a common drive, said handling device being arranged in the area of said object storage device, the storage apparatus being built as a standalone apparatus which does not include structure in said housing for processing the objects.

\* \* \* \* \*